United States Patent
Kapusta et al.

(10) Patent No.: US 6,201,407 B1
(45) Date of Patent: *Mar. 13, 2001

(54) CIRCULAR PRODUCT TERM ALLOCATIONS SCHEME FOR A PROGRAMMABLE DEVICE

(75) Inventors: Richard L. Kapusta, San Jose, CA (US); Jeffery Mark Marshall, Austin, TX (US); Haneef D. Mohammed, Beaverton, OR (US)

(73) Assignee: Cypress Semiconductor Corp, San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/946,030

(22) Filed: Oct. 7, 1997

(51) Int. Cl.[7] ............................. G06F 7/38; H03K 19/177
(52) U.S. Cl. ................................................. 326/39
(58) Field of Search .................... 326/39, 40, 41, 326/38; 365/185.17; 395/800.01; 716/12, 17

(56) References Cited

U.S. PATENT DOCUMENTS

| | | | |
|---|---|---|---|
| 4,878,200 | * 10/1989 | Asghar et al. | 365/185.17 |
| 5,136,188 | * 8/1992 | Ha et al. | 326/39 |
| 5,521,529 | * 5/1996 | Agrawal et al. | 326/41 |
| 5,781,030 | * 7/1998 | Agrawal et al. | 326/39 |
| 5,799,176 | * 8/1998 | Kapusta et al. | 326/39 X |
| 5,811,987 | * 9/1998 | Ashmore et al. | 326/39 |
| 5,848,285 | * 12/1998 | Kapusta et al. | 395/800.01 |

* cited by examiner

Primary Examiner—Patrick Wamsley
(74) Attorney, Agent, or Firm—Wagner, Murabito & Hao LLP (57) ABSTRACT

A circular product term allocator configured to provide connections for product term signals to macrocells of a programmable logic device is provided. The circular product term allocator may provide such connections through a logic OR function. Alternatively, a homogeneous product term allocator may be configured to provide connections for product term signals to macrocells of a programmable logic device. The homogeneous product term allocator may be configured to provide each of the product term signals to an equal number of macrocells. In yet another embodiment, a programmable logic device includes a plurality of macrocells and a product term allocator configured to provide an equal number of product term signals to each of the macrocells. In yet a further embodiment, a method of distributing product terms in a programmable logic device is accomplished by configuring a product term allocator to provide an equal number of product terms, but fewer than all of the product terms, to each of the macrocells.

15 Claims, 6 Drawing Sheets

Fig. 5 w = number of macrocells in the logic block
x = total unique product terms to be distributed
y = maximum number of product terms per macrocell
z = amount of shift per macrocell
o = the amount of pterms that wrap around at the bottom
s = number of macrocells that each product term can be shared by y = o + z
z = x / w          and must be an integer
o = (((w-1)*z)+y) - x
s = y / z          and must be a positive integer
s = (o / z) + 1

| w  | x  | y  | z | o  | s  |
|----|----|----|---|----|----|
| 16 | 80 | 15 | 5 | 10 | 3  |
| 16 | 80 | 20 | 5 | 15 | 4  |
| 16 | 80 | 25 | 5 | 20 | 5  |
| 16 | 80 | 30 | 5 | 25 | 6  |
| 16 | 64 | 16 | 4 | 12 | 4  |
| 16 | 64 | 20 | 4 | 16 | 5  |
| 16 | 64 | 24 | 4 | 20 | 6  |
| 16 | 64 | 28 | 4 | 24 | 7  |
| 16 | 64 | 32 | 4 | 28 | 8  |
| 16 | 48 | 15 | 3 | 12 | 5  |
| 16 | 48 | 18 | 3 | 15 | 6  |
| 16 | 48 | 21 | 3 | 18 | 7  |
| 16 | 48 | 24 | 3 | 21 | 8  |
| 16 | 48 | 27 | 3 | 24 | 9  |
| 16 | 48 | 30 | 3 | 27 | 10 |

| w  | x   | y  | z | o  | s  |
|----|-----|----|---|----|----|
| 32 | 160 | 15 | 5 | 10 | 3  |
| 32 | 160 | 20 | 5 | 15 | 4  |
| 32 | 160 | 25 | 5 | 20 | 5  |
| 32 | 160 | 30 | 5 | 25 | 6  |
| 32 | 128 | 16 | 4 | 12 | 4  |
| 32 | 128 | 20 | 4 | 16 | 5  |
| 32 | 128 | 24 | 4 | 20 | 6  |
| 32 | 128 | 28 | 4 | 24 | 7  |
| 32 | 128 | 32 | 4 | 28 | 8  |
| 32 | 96  | 15 | 3 | 12 | 5  |
| 32 | 96  | 18 | 3 | 15 | 6  |
| 32 | 96  | 21 | 3 | 18 | 7  |
| 32 | 96  | 24 | 3 | 21 | 8  |
| 32 | 96  | 27 | 3 | 24 | 9  |
| 32 | 96  | 30 | 3 | 27 | 10 |

Fig. 6

CIRCULAR PRODUCT TERM ALLOCATIONS SCHEME FOR A PROGRAMMABLE DEVICE

FIELD OF THE INVENTION

The present invention relates to programmable logic devices and, more particularly, to product term allocation schemes in such devices.

BACKGROUND

Various programmable logic architectures are known, including, for example, programmable logic devices ("PLD"), programmable logic arrays ("PLA") and programmable array logic ("PAL™"). Although there are many differences between the various architectures, each of the PLD, PLA, and PAL architectures typically includes a set of input conductors directly coupled as inputs to an array of logical AND gates ("product term array"), the outputs of which, in turn, act as inputs to another portion of the logic device.

Figure 1:
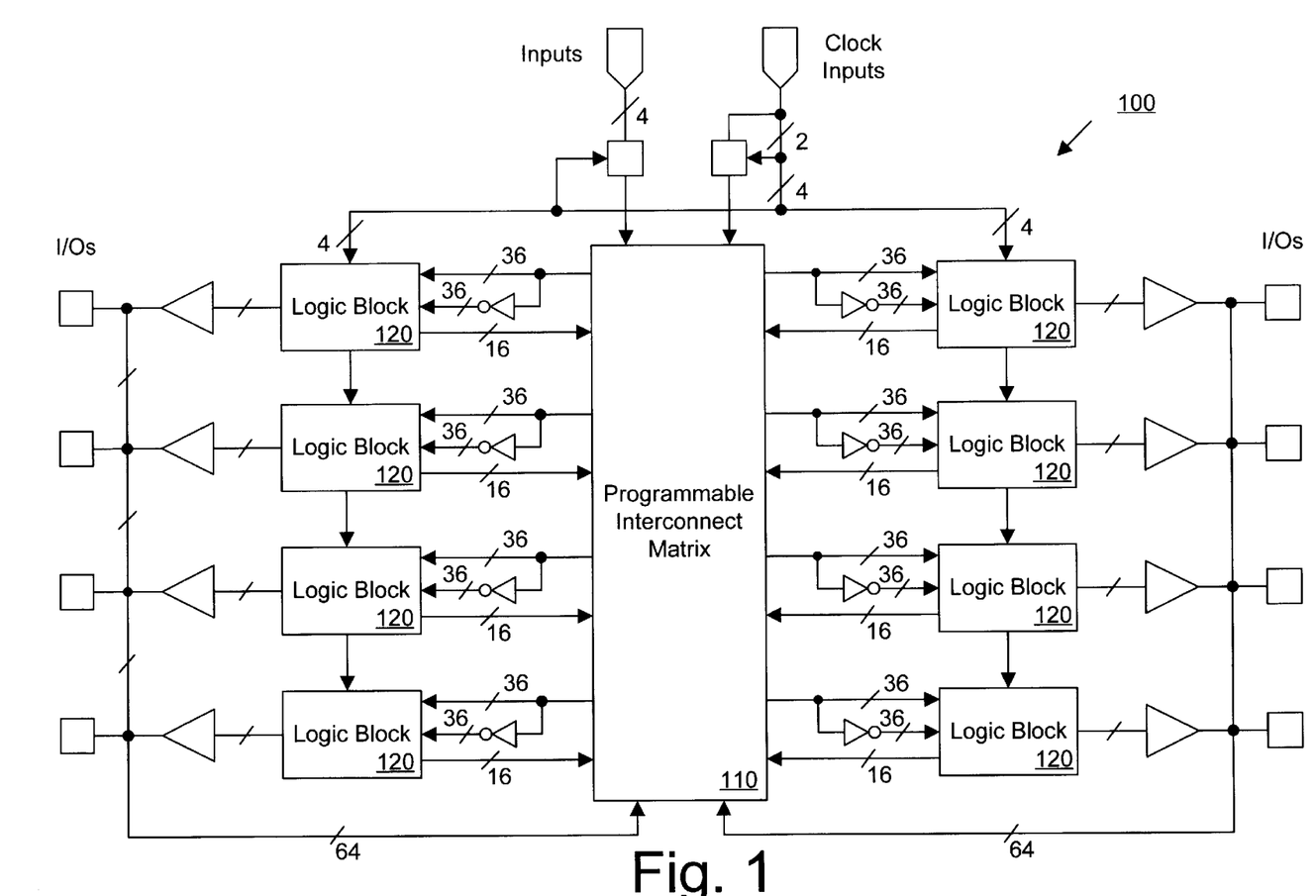
FIG. 1 illustrates a conventional complex programmable logic device.

FIG. 1 shows a conventional complex programmable logic device ("CPLD") 100 which includes a programmable interconnect matrix ("PIM") 110 and a number of logic blocks 120. Although eight logic blocks 120 are shown, other configurations of CPLD 100 may have as few as two logic blocks 120 or more than eight logic blocks 120. For the CPLD 100 shown in FIG. 1, a total of 262 inputs, each of which is connected to the PIM 110, are provided. PIM 110 is capable of providing each logic block 120 with its own set of input terms by independently selecting as many as 36 of the possible 262 input signals as input terms for each logic block 120. As shown, the logic complements for each of the 36 signals output by the PIM 110 are also provided to each logic block 120. Thus, each logic block 120 receives as many as 72 input terms from the PIM 110.

The PIM 110 includes a number of programmable elements (not shown) for controlling an array of multiplexers (not shown) to reduce the total number of programmable elements required. The programmable elements may be volatile memory elements such as static random access memory ("SRAM"), non-volatile memory elements such as flash electrically erasable programmable read-only memory ("Flash EEPROM"), fuses or anti-fuses. Alternatively, the programmable elements of the PIM 110 may be implemented to control a matrix of crosspoint switches. Such an implementation, however, increases the total number of programmable elements required to make the same number of connections. Whether the connections between input conductors and output conductors are provided by a crosspoint switch matrix or by an array of multiplexers, each output conductor can be connected to a maximum of one input conductor. Thus, both forms of connection perform a multiplexing function in the sense that both forms of connection provide for the selection of one input conductor from a set of many input conductors. Therefore, as used herein, the term multiplexer will be understood to encompass any circuit that performs a multiplexing function, regardless of the number of programmable elements required to control that circuit.

The 262 inputs to the PIM include 128 feedback signals, 128 input signals, and six dedicated input signals, which include four clock signals. Sixteen feedback signals and as many as 16 input signals are provided by each logic block 120. Each logic block 120 may be programmed to perform selected logic functions, for example using subcombinations of the 72 input terms provided by the PIM 110. Each logic block 120 has 16 input/output ("I/O") pins, which may be used as either inputs to the PIM 110 or outputs of the CPLD 100.

Conceptually, CPLD 100 may be regarded as a PIM coupled in series with eight PLDs coupled in parallel, wherein each logic block 120 corresponds to a single PLD. Intermediate stages in the outputs of each of the eight PLDs are fed back as inputs to the PIM. Depending on the particular set of input signals routed to the outputs of the PIM and the programmed logic functions for each logic block 120, the eight PLDs may, in fact, act as two or more PLDs coupled in series with each other. CPLD 100 thus provides a highly versatile logic device which may be implemented on a single semiconductor die.

Figure 2:
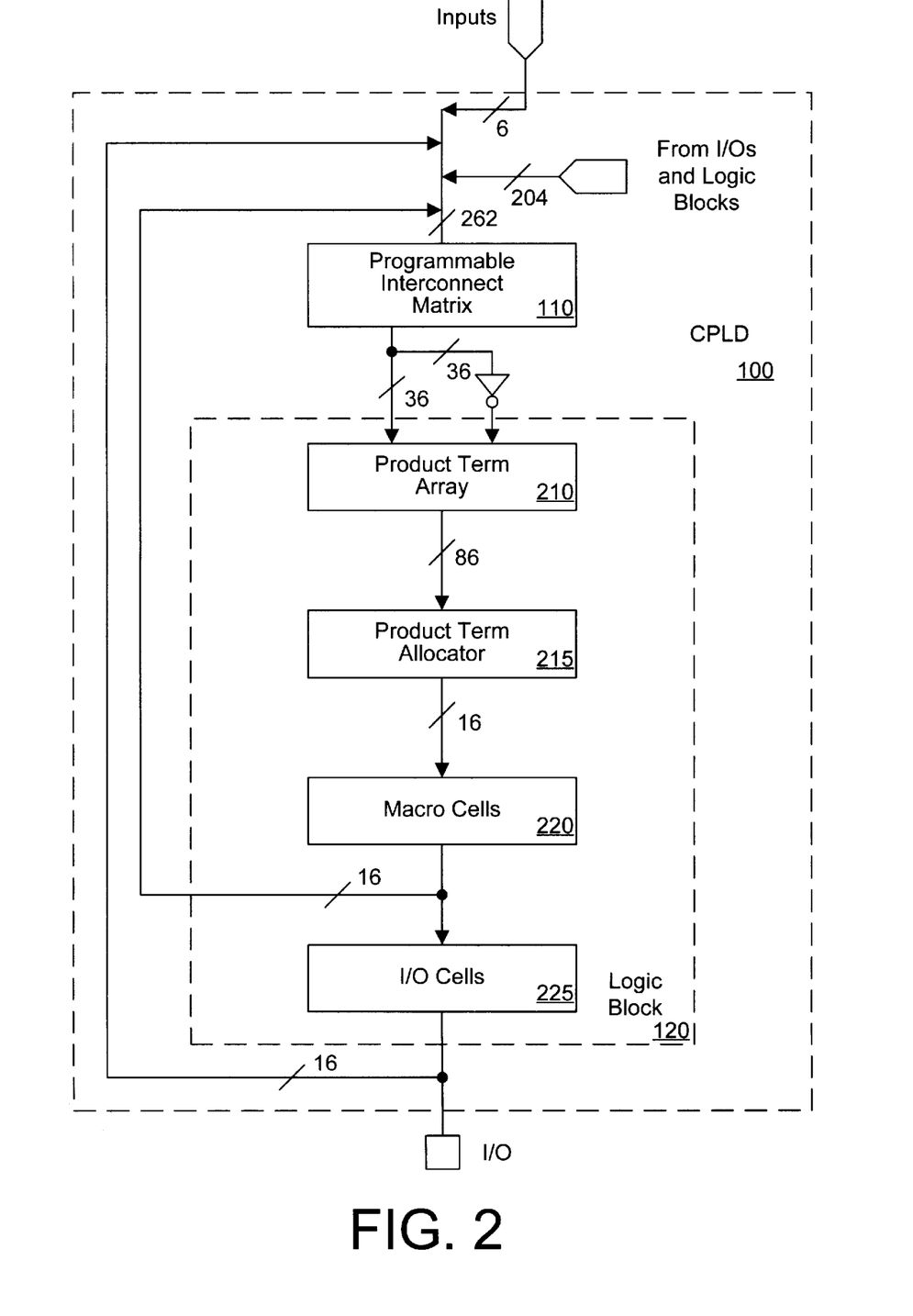
FIG. 2 illustrates a conventional logic block for the programmable logic device of FIG. 1.

FIG. 2 shows portions of CPLD 100 in greater detail. Specifically, logic block 120 is shown as including a product term array 210, a product term allocator 215, macrocells 220 and I/O cells 225. The product term array for this embodiment is a fully programmable AND array, although other implementations may be used. The product term allocator 215 allocates product terms from the product term array 210 to 16 macrocells 220. The product term allocator 215 "steers" product terms to macrocells as needed. For example, if one macrocell requires 10 product terms while another requires only three product terms, the product term allocator 215 steers 10 product terms to one macrocell and three product terms to the other macrocell. From 0 to 16 product terms can be steered to any one macrocell.

The outputs for each of the 16 macrocells 220 are fed back to the PIM 110 as input signals. This specific architecture of the macrocells 220 may be any appropriate architecture. The 16 outputs of the macrocells 220 are also fed to the 16 I/O cells 225.

The output signals of the I/O cells 225 are fed back as input signals to the PIM 110 and are also provided to I/O pins.

Figure 3:
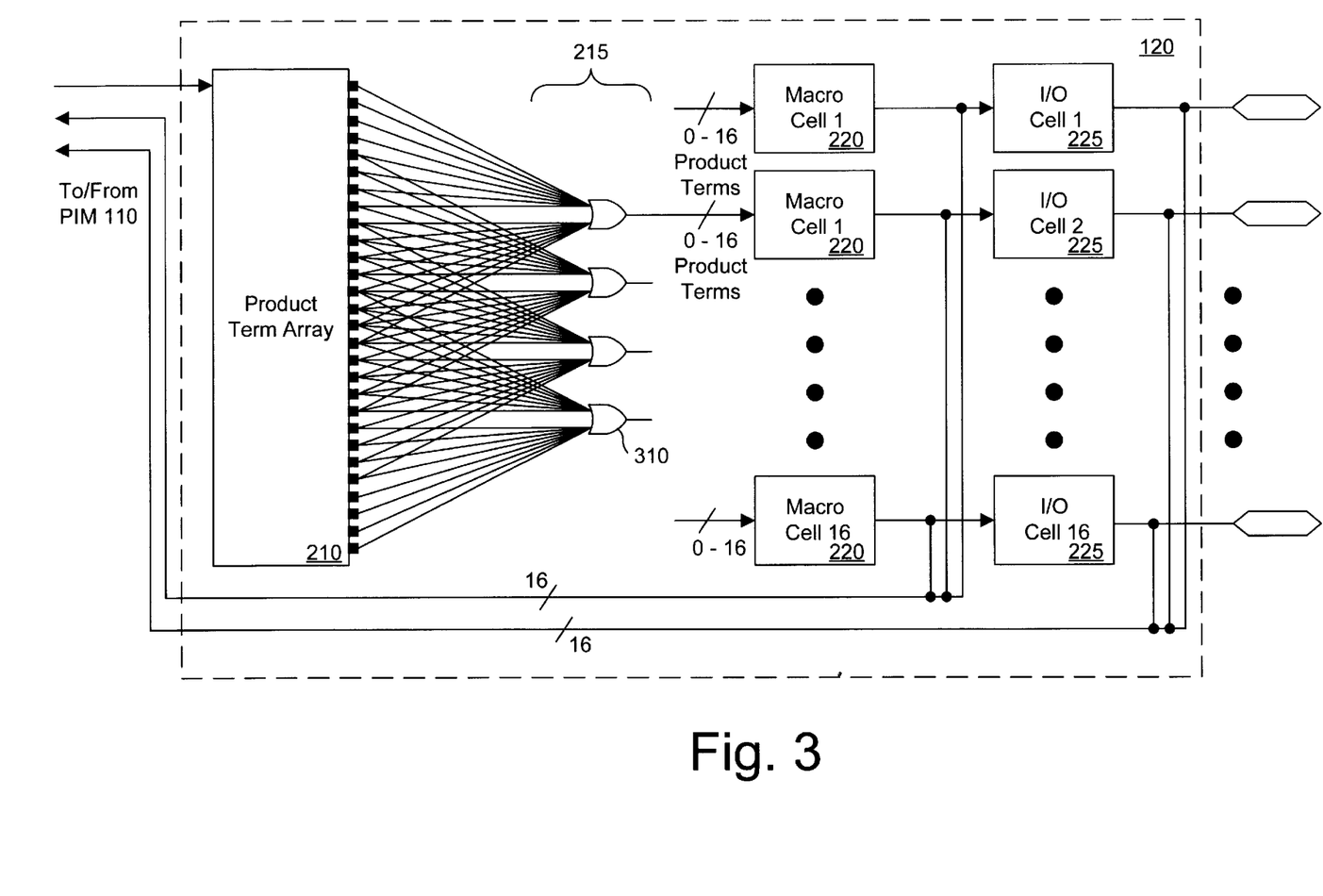
FIG. 3 illustrates a conventional product term allocation scheme for the logic block of FIG. 2.

FIG. 3 shows the product term allocation scheme within logic block 120 in more detail. As shown, signals from PIM 110 are applied to the product term array 210. Output signals from the product term array 210 are then provided to the product term allocator 215 which is shown in FIG. 3 as implementing a logic OR function. For each of the logic OR terms 310 of product term allocator 215, the output of that term is provided to one of the 16 macrocells 220. As shown, each logic OR function within product term allocator 215 may provide from 0 to 16 product terms from product term array 210 to each macrocell 220, although some of the product terms will be available to only one unique macrocell.

Figure 4:
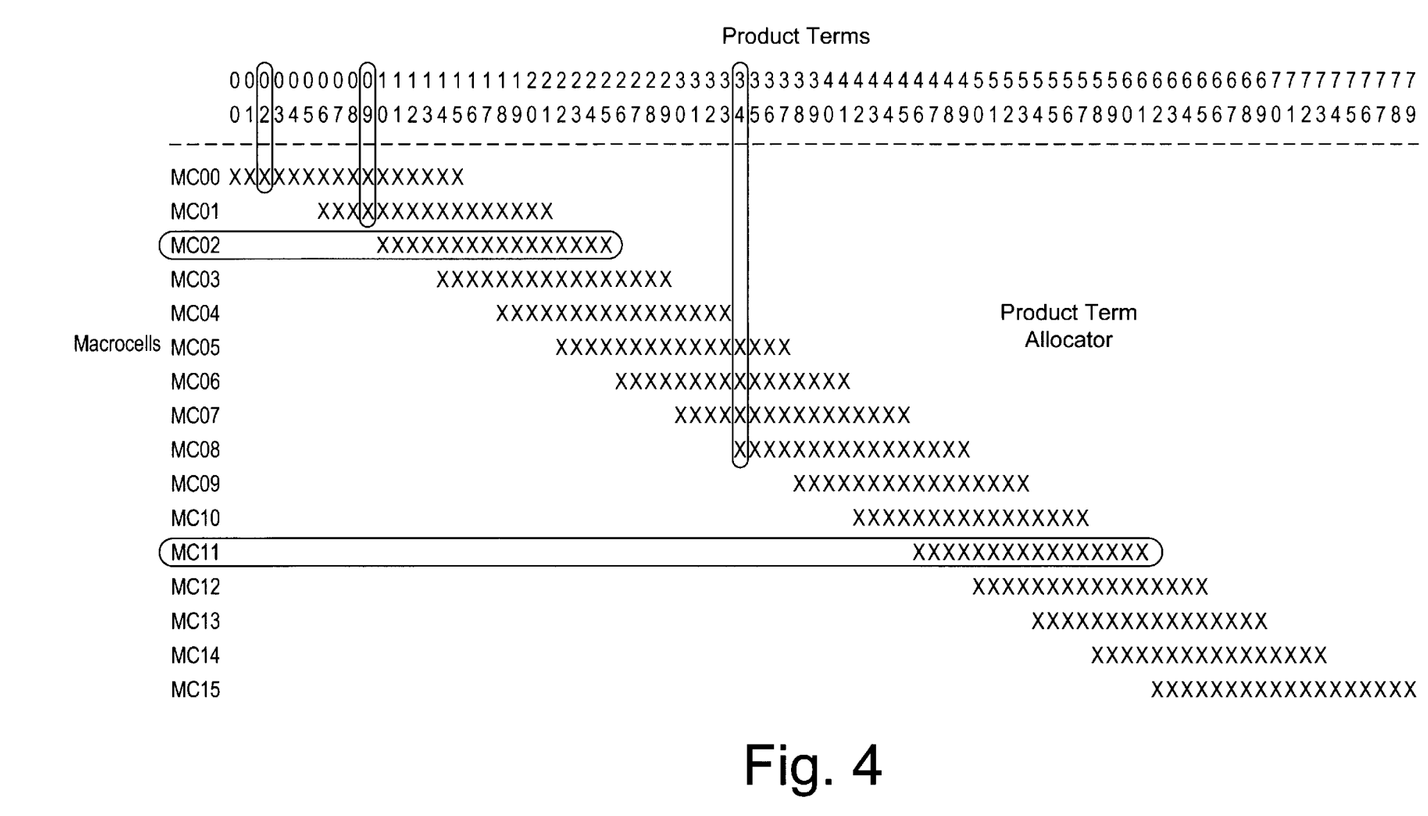
FIG. 4 is a graphical illustration of the product term allocation scheme shown in FIG. 3.

FIG. 4 shows this product term allocation scheme in more detail. In particular, FIG. 4 is a graphical illustration of the allocation of product terms to macrocells within programmable logic device 100. Along the top, the 80 product terms of product term array 210 are enumerated. The vertical axis represents the 16 macrocells 220 per logic block 120. Each logic OR term 310 provided by the product term allocator 215 is illustrated as providing up to 16 of the product terms to each macrocell. For example, macrocell 02 may be provided with product terms 10–25. Similarly, macrocell 11 may be provided with product terms 46–61. As indicated, however, product terms 00–05 are available only to macrocell 00 and product terms 74–79 are available only to macrocell 15. Each of the other product terms 06–73 is shared by at least two macrocells, for example macrocells 00 and 01 share product term 09, or up to four macrocells, for example, product terms 10–34 are shared by macrocells 05, 06, 07 and 08.

The product term allocation scheme illustrated in FIG. 4 is non-homogeneous in that some product terms can be provided to up to four macrocells while other product terms are available to only one macrocell. This causes a problem for routing software which is used to implement desired logic functions by programming CPLD 100. The routing software is limited in that if, for example, product terms 00 and 04 need to be provided to separate macrocells, the logic function which requires such an implementation cannot be fit to CPLD 100. Instead, those signals would have to be routed to different product terms which are available in different macrocells, thus leaving fewer overall product terms available for allocation. The overall result is that some logic functions simply will not be able to be fit in CPLD 100. Accordingly, what is desired is an improved product term allocation scheme.

SUMMARY OF THE INVENTION

The present invention provides product term distribution flexibility beyond that currently available in complex programmable logic devices. At the same time, the product term distribution scheme achieves a homogeneous distribution of product terms without utilizing a significant amount of dedicated circuitry.

In one embodiment, a circular product term allocator configured to provide connections for product term signals to macrocells of a programmable logic device is provided. The circular product term allocator may provide such connections through a logic OR function.

In another embodiment, a homogeneous product term allocator may be configured to provide connections for product term signals to macrocells of a programmable logic device. The homogeneous product term allocator may be configured to provide each of the product term signals to an equal number of macrocells. Such connections may be provided through logic OR functions.

In yet another embodiment, a programmable logic device includes a plurality of macrocells and a product term allocator configured to provide an equal number of product term signals to each of the macrocells. The product term allocator may be configured to provide logic OR functions to couple the product term signals to the macrocells.

In yet a further embodiment, a method of distributing product terms in a programmable logic device is accomplished by configuring a product term allocator to provide an equal number of product terms, but fewer than all of the product terms, to each of the macrocells.

These and other features and advantages of the present invention will be apparent from the detailed description and accompanying drawings which follow.

BRIEF DESCRIPTION OF THE DRAWINGS

The present invention is illustrated by way of example, but not limitation, in the figures of the accompanying drawings in which.

DETAILED DESCRIPTION

Described herein is a circular product term allocation scheme which achieves a product term distribution flexibility beyond that currently available in complex programmable logic devices. The present product term allocation scheme provides for homogeneous distribution of product terms to macrocells without utilizing a great deal of dedicated circuitry. As discussed above, currently available CPLDs provide limited product term distribution schemes which are non-homogeneous. Such architectures do not allow for fitting a variety of logic functions. In particular, a non-homogeneous product term distribution scheme places an unnecessary burden on the fitting software and causes an inefficient utilization of the total available product terms in a CPLD. Having a non-homogeneous distribution scheme creates macrocells which have more flexibility (in terms of their ability to accept various product terms) than other macrocells within the same logic block. This forces fitting software to favor certain macrocells over others in the allocation of logic, which tends to create inefficiencies in the final implementations of a circuit.

A homogeneous product term distribution scheme in accordance with the present invention allows the fitting software to allocate logic to any macrocell within a logic block without having to weight certain macrocells differently. No macrocell within a block is any more or less available resource than any other macrocell. This improves logic fitting efficiency in the hardware itself, as well as increases the overall potential to take advantage of all of the logic that is present in a device via the fitting software.

In one embodiment, a circular product term allocator configured to provide connections for product term signals to macrocells of a programmable logic device is provided. The circular product term allocator may provide such connections through logic OR functions. Alternatively, a homogeneous product term allocator configured to provide connections for product term signals to macrocells of a programmable logic device may be provided. The homogeneous product term allocator may be configured to provide each of the product term signals to an equal number of the macrocells of a logic block. Again, such connections may be provided by logic OR functions.

In further embodiments of the present invention, a programmable logic device is provided. The programmable logic device may include a plurality of macrocells and a product term allocator. The product term allocator may be configured to provide an equal number of product term signals to each of the macrocells. The programmable logic device may be further configured so that the product term allocator provides logic OR functions to couple the product term signals to the macrocells.

In yet a further embodiment, product terms are distributed in a programmable logic device according to a method which includes configuring a product term allocator to provide an equal number of the product terms, but fewer than all of the product terms, to each of the macrocells.

Figure 5:
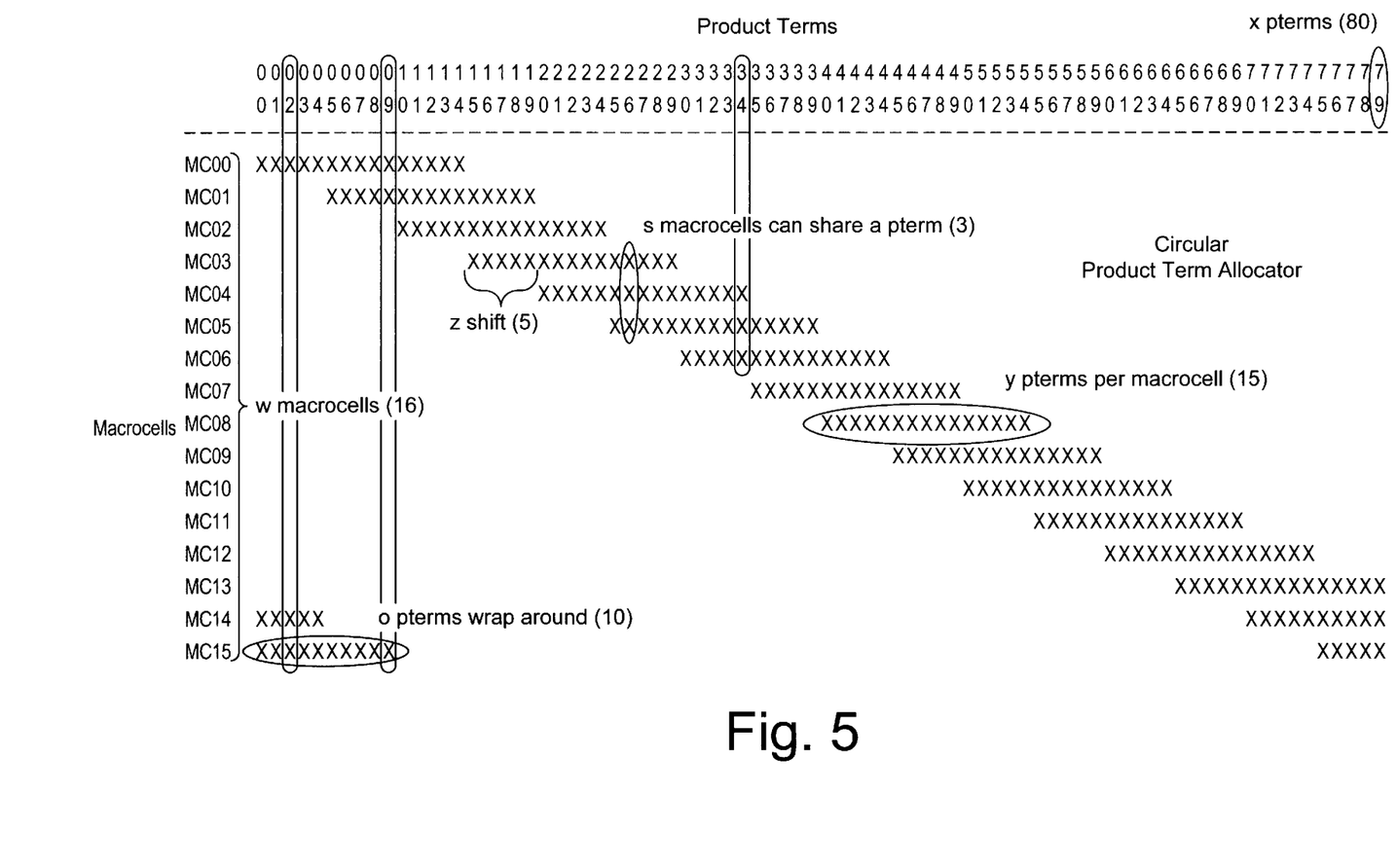
FIG. 5 is a graphical illustration of a product term allocation scheme according to one embodiment of the present invention.

One exemplary embodiment of the present invention having the features described above is illustrated graphically in FIG. 5. As shown, for a logic block including 80 product terms and 16 macrocells, a homogeneous product term allocation scheme wherein each product term is available to exactly three macrocells is provided. The homogeneous scheme illustrated in FIG. 5 is also circular in nature in that some of the low order product terms "wrap around" to be provided to the high order macrocells. That is, the product terms 00–04 are provided to macrocells 14 and 15, in addition to being provided to macrocell 00. Also, the product terms 05–09 are provided to macrocell 15, in addition to being provided to macrocells 00 and 01. The homogeneous nature of the product term allocation scheme is achieved by providing an equal "shift" when allocating product terms amongst the macrocells while the circular nature of the scheme is provided by allowing the wrap around.

To illustrate, consider the product terms which are provided to macrocells 00 and 01. Product terms 00 through 14 are provided to macrocell 00 while product terms 05 through 19 are provided to macrocell 01. This illustrates a shift of five product terms between macrocells (i.e., product term 05 is the first one shared between macrocells 00 and 01). Likewise, a shift of five more product terms is implemented, from the product term 05 to product term 09, between macrocells 01 and 02. Thus, product term 10 is the first product term shared between macrocell 01 and macrocell 02. This homogeneous product term shift (for the illustrated embodiment it is five product terms) is maintained throughout the allocation scheme. As a result, each product term is provided to exactly three macrocells, achieving the circular and homogeneous results shown.

It is possible to achieve a homogeneous product term allocation scheme without implementing a circular product term allocation scheme. In such instances, no product terms would wrap around. It is also possible to achieve a circular product term allocation scheme which is not homogeneous. Such a scheme would allow for the wrap around discussed above but would provide different product term shifts between marcocells. Although such schemes are possible, they are not necessarily preferred over the circular, homogeneous product term allocation scheme shown in FIG. 5.

This is because the circular product term allocation scheme ensures that every product term is provided to the same number of macrocells, thus ensuring flexibility amongst product term allocation. Other product term allocation schemes of the past may have included providing every product term to every macrocell. However, for more than a few product terms and/or a few macrocells, such an implementation requires a great deal of logic and, correspondingly, a significant amount of die area. For large numbers of product terms and/or macrocells, such an allocation scheme simply is not a cost effective solution. In contrast, the product term allocation scheme shown in FIG. 5 provides a flexible and cost effective (in terms of silicon die area) allocation scheme. At most, a few product terms may need to be duplicated to achieve the wrap around effect.

Although there are multiple ways to implement a homogeneous product term allocation scheme such as that shown in FIG. 5, one method would be to use the following parameters:

w=the number of macrocells in the logic block
x=the total number of unique product terms to be distributed
y=the maximum number of product terms per macrocell
z=the amount of shift per macrocell
o=the number of product terms that wrap around
s=the number of macrocells that each product term can be shared by The relationship between these variables that should be met in order to create a working homogeneous product term distribution scheme is as follows:

$y=o+z$
$z=x/w$ (and must be an integer)
$o=(((w-1) *z)+y)-x$ (and must be a positive integer)
$s=y/z=(o/z)+1$.

In the above equations, w and x are independent variables and should be selected by a user or manufacturer. Variables y and z both depend upon one another, so one of these should also be selected. Once these values are chosen, the rest of the relationships may be satisfied.

Figure 6:
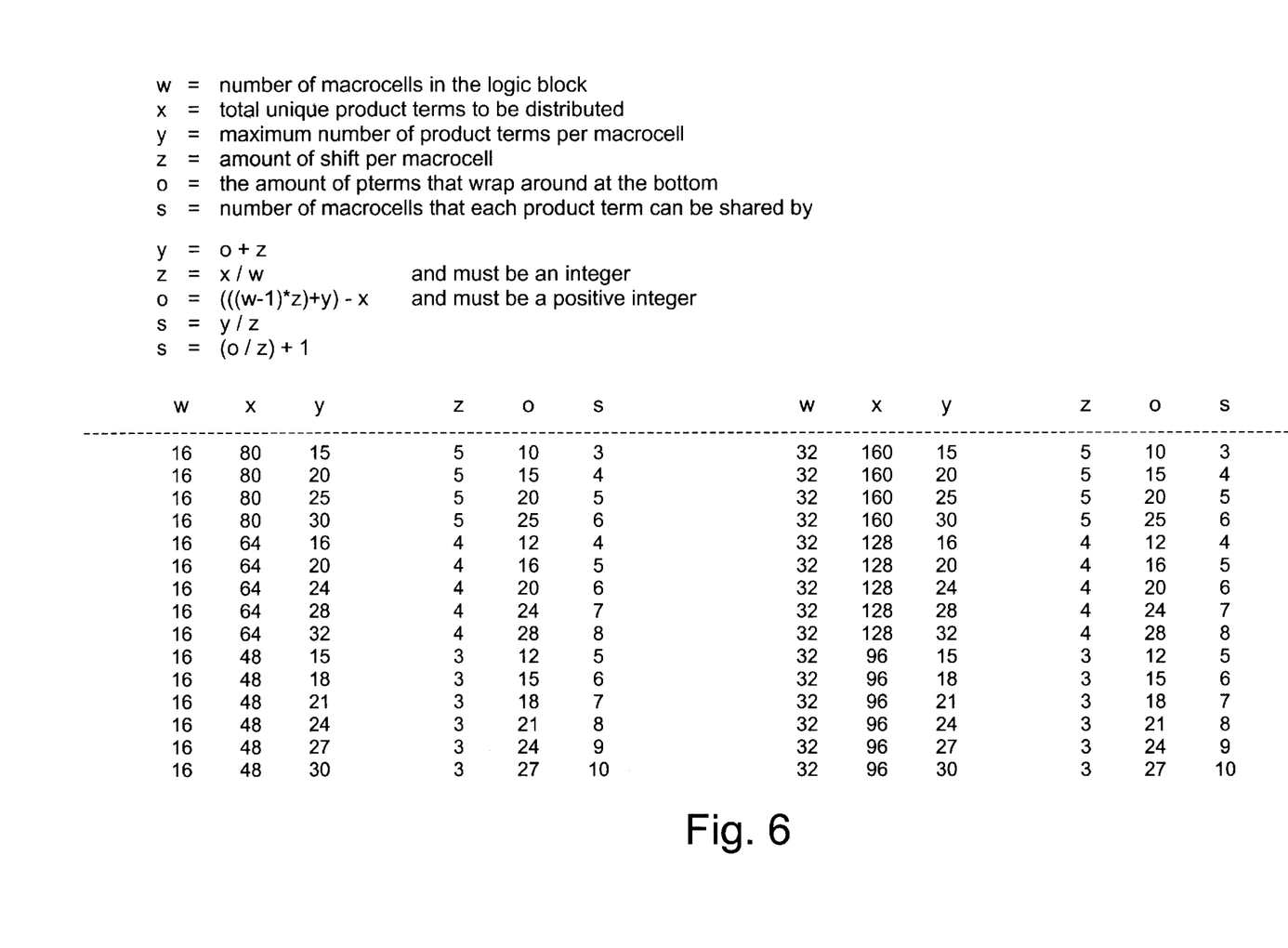
FIG. 6 is a table illustrating various combinations of macrocells and product terms according to a homogeneous product term allocation scheme in accordance with one embodiment of the present invention.

FIG. 6 illustrates a table which shows exemplary sets of parameters which meet all of the above requirements. For example, the table of FIG. 6 shows the product term allocation scheme graphically illustrated in FIG. 5 wherein 16 macrocells per block share 80 total product terms with a maximum of 15 product terms to be shared per macrocell. As shown in the table of FIG. 6 and in the illustration of FIG. 5, the shift required is 5 (as discussed above), which allows for 10 product terms to be wrapped around and ensures that every product term is allocated to exactly three macrocells.

The table of FIG. 6 also provides a number of other exemplary embodiments, however, it should be appreciated that numerous other embodiments are possible, all according to the above design rules. In short, the above design rules provide a method of distributing product terms in a programmable logic device which includes configuring the product term allocator to provide an equal number of product terms, but fewer than all of the product terms, to each of the macrocells. The schemes shown in the table of FIG. 6 may represent commercially viable CPLD implementations, however, there are many other sets of values which satisfy the above design relationships.

Thus, a homogeneous product term allocation scheme has been described. Although in the foregoing specification the invention has been described with reference to specific exemplary embodiments thereof, it should be appreciated that various modifications and changes may be made thereto without departing from the broader spirit and scope of the invention as set forth in the appended claims. For example, in a preferred embodiment, the product term allocator configured according to the present invention may implement logic OR functions (e.g., using OR gates or equivalents thereof, such as NOR gates with appropriate inverters, etc.), however, other configurations may implement other logic functions, for example, XOR functions. It will be appreciated that, at least to some degree, the logic function provided by the product term allocator may be governed by the logic function provided by the product term array. For example, as described herein, a product term array provides a plurality of logic AND functions (e.g., which may be implemented using AND gates, NAND gates, or other logic gates configured to ultimately provide a logic AND function). However, if the product term array were configured to provide other logic functions, e.g., NAND functions, XOR functions, etc., it may be appropriate for the product term allocator to provide something other than or in addition to logic OR functions (of course, in such cases, the terms "product term array" and "product term allocator" may have to be changed to reflect the appropriate logic functions being provided—thus, as used herein and in the claims which follow, these terms should not necessarily be limited to embodiments where the product term array provides only logic AND functions and the product term allocator provides only logic OR functions). Stated another way, given a product term allocator which implements certain logic functions, a product term array which provides appropriate logic functions may be used. Thus, the specification and drawings should be regarded as illustrative rather than restrictive in nature.

What is claimed is:

1. A circular product term allocator configured to provide connections for product term signals to macrocells of a programmable logic device such that every product term is provided to an equal number of macrocells from the output of the circular product term allocator and low order product terms wrap around to be provided to high order macrocells.

2. A programmable logic device comprising the circular product term allocator of claim 1.

3. The programmable logic device of claim 2 wherein said circular product term allocator is further configured to be homogeneous.

4. The programmable logic device of claim 3 further comprising a product term array coupled to said product term allocator.

5. The programmable logic device of claim 4 wherein said product term array is configured to provide a plurality of logic AND functions.

6. The programmable logic device of claim 5 wherein said product term array and said product term allocator are included within a logic block of said programmable logic device.

7. The programmable logic device of claim 6 wherein said logic block further includes a plurality of macrocells coupled to said product term allocator.

8. A circular product term allocator as in claim 1 wherein a plurality of said connections comprise logic OR functions.

9. A programmable logic device, comprising:
a plurality of macrocells; and
a circular product term allocator configured to provide an equal number of product term signals to each of the macrocells, such that an equal shift when allocating product terms amongst macrocells is provided so that every product term is provided to an equal number of macrocells from the output of the product term allocator, said equal number being fewer than all of said product terms, and low order product terms wrap around to be provided to high order macrocells.

10. A programmable logic device as in claim 9 wherein the circular product term allocator is further configured to be homogenous.

11. A programmable logic device as in claim 10 further comprising a product term array coupled to said circular product term allocator.

12. A programmable logic device as in claim 11 wherein the product term array is configured to provide a plurality of logic AND functions.

13. A programmable logic device as in claim 9 further comprising a product term array coupled to said circular product term allocator.

14. A programmable logic device as in claim 13 wherein the product term array is configured to provide a plurality of logic AND functions.

15. A programmable logic device as in claim 9 wherein the circular product term allocator is further configured to provide logic OR functions to couple the product term signals to the macrocells.

* * * * *